United States Patent
Uezono et al.

(10) Patent No.: US 10,401,424 B2
(45) Date of Patent: Sep. 3, 2019

(54) SOFT ERROR RATE CALCULATION DEVICE AND CALCULATION METHOD FOR SEMICONDUCTOR LARGE SCALE INTEGRATION (LSI)

(71) Applicant: HITACHI, LTD., Tokyo (JP)

(72) Inventors: Takumi Uezono, Tokyo (JP); Tadanobu Toba, Tokyo (JP); Kenichi Shimbo, Tokyo (JP); Fumihiko Nagasaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 53 days.

(21) Appl. No.: 15/576,144

(22) PCT Filed: Apr. 6, 2016

(86) PCT No.: PCT/JP2016/061191
§ 371 (c)(1),
(2) Date: Nov. 21, 2017

(87) PCT Pub. No.: WO2016/185818
PCT Pub. Date: Nov. 24, 2016

(65) Prior Publication Data
US 2018/0149695 A1    May 31, 2018

(30) Foreign Application Priority Data

May 21, 2015 (JP) ................................. 2015-103319

(51) Int. Cl.
*G01R 31/28* (2006.01)
*G01R 31/26* (2014.01)
(Continued)

(52) U.S. Cl.
CPC ..... *G01R 31/2881* (2013.01); *G01R 31/2601* (2013.01); *G01R 31/265* (2013.01); *G01R 31/303* (2013.01); *G01R 31/31816* (2013.01)

(58) Field of Classification Search
CPC ..... G01N 27/904; G01N 27/902; F16L 55/38; F16L 55/40; F16L 2101/30
(Continued)

(56) References Cited

U.S. PATENT DOCUMENTS 5,192,214 A * 3/1993 Samarov ................ H01R 12/62
                                                        439/493
6,219,568 B1 * 4/2001 Kelly ................ A61B 5/04085
                                                        600/386
(Continued)

FOREIGN PATENT DOCUMENTS

JP    2004-125633 A    4/2004
JP    2005-276360 A    10/2005
(Continued)

OTHER PUBLICATIONS

International Search Report dated Jun. 21, 2016 of International Application No. PCT/JP2016/061191.

*Primary Examiner* — Giovanni Astacio-Oquendo
(74) *Attorney, Agent, or Firm* — Volpe and Koenig, P.C.

(57) ABSTRACT

Neutron soft error rate derivation is calculated from data at the low energy neutron radiation. An outline value of an SEU cross-section function corresponding to a given neutron energy value is outputted. This outline value and the low energy neutron spectrum data are used to calculate an error count basic value of errors to occur over time. An error count actual measurement value over time is calculated from an error count during radiation of low energy neutrons and low energy neutron radiation time. The error count basic value and the error count actual measurement are used to calculate a proportionality coefficient of the SEU cross-section function. While holding a natural neutron spectrum, an error rate calculator outputs a neutron flux corresponding to a neutron energy value. The neutron soft error rate is calculated by an integration operation of multiplying the SEU cross-section function with the natural neuron spectrum.

6 Claims, 4 Drawing Sheets

(51) Int. Cl.
*G01R 31/265* (2006.01)
*G01R 31/303* (2006.01)
*G01R 31/3181* (2006.01)

(58) Field of Classification Search
USPC ........ 324/242, 244, 243, 240, 239, 228, 200
See application file for complete search history.

(56) References Cited

U.S. PATENT DOCUMENTS

| | | | |
|---|---|---|---|
| 7,967,644 B2* | 6/2011 | Pepe ..................... | H01R 13/02 |
| | | | 439/676 |
| 2005/0211890 A1 | 9/2005 | Ibe et al. | |
| 2008/0273393 A1 | 11/2008 | Chen et al. | |
| 2016/0178714 A1* | 6/2016 | Fautz ................... | G01R 33/483 |
| | | | 324/309 |
| 2017/0319097 A1* | 11/2017 | Amthor ................. | A61B 5/055 |
| 2018/0024214 A1* | 1/2018 | Bhat ................. | G01R 33/4828 |
| | | | 324/309 |

FOREIGN PATENT DOCUMENTS

| | | |
|---|---|---|
| JP | 3792092 B | 6/2006 |
| JP | 2008-282516 A | 11/2008 |

* cited by examiner

SOFT ERROR RATE CALCULATION DEVICE AND CALCULATION METHOD FOR SEMICONDUCTOR LARGE SCALE INTEGRATION (LSI)

TECHNICAL FIELD

The present invention relates to a method of evaluating and calculating an incidence of soft errors in semiconductor LSI induced by radiation.

BACKGROUND ART

Japanese Patent Publication No. 03792092 (PTL 1) is cited as background art. This patent describes "a method of evaluating a cosmic ray soft error tolerance of a semiconductor device comprising the steps of: dividing spectral distribution of cosmic ray neutrons into a plurality of energy bands respectively having a plurality of predetermined energy values as representative values; obtaining soft error partial cross-sectional areas of the semiconductor device corresponding to the plurality of energy values; and obtaining a sum of the soft error partial cross-sectional areas weighted with total fluxes of the respective energy bands, wherein a soft error rate of the semiconductor device in a prescribed actual use environment is estimated by using the sum of the soft error partial cross-sectional areas."

CITATION LIST

Patent Literature

[PTL 1]
Japanese Patent Publication No. 03792092

SUMMARY OF INVENTION

Technical Problem

In the above-described technique, the soft error partial cross-sectional areas are empirically obtained by radiating neutron beams having the energy corresponding to the divided energy bands, and a neutron soft error rate in nature is derived therefrom. However, this technique involves neutron radiation several times while changing the neutron energy. As a consequence, the evaluation is likely to require high costs and a long time.

An object of the present invention is to enable derivation of a neutron soft error rate of semiconductor LSI in an actual use environment only by using data obtained at the time of low neutron energy radiation as data to be used for the derivation of the neutron soft error rate.

Solution to Problem

To solve the problem, a soft error calculation device for semiconductor LSI according to the present invention includes: a holder for an SEU cross section function; a calculator which calculates an error count basic value of errors to occur per unit time from an outline value of the SEU cross section function and low energy neutron spectrum data; an error count actual measurement value calculator which calculates an error count actual measurement value per unit time from inputted data; another calculator which identifies the SEU cross section function from a calculation result of the former calculator; another holder for a natural neutron spectrum; and an error rate calculator which calculates a soft error rate of a semiconductor device in nature from the calculation result and the held data.

Advantageous Effects of Invention

According to the present invention, data at the time of low neutron energy radiation are made available as actual measurement data to be used for deriving a neutron soft error rate. As a consequence, it is possible to utilize the data not only at a high output facility but also at a low output facility. Moreover, it is possible to suppress irradiation of radiation equipment and to reduce an operating cost of an accelerator at the time of evaluation.

DESCRIPTION OF EMBODIMENTS

Figure 1:
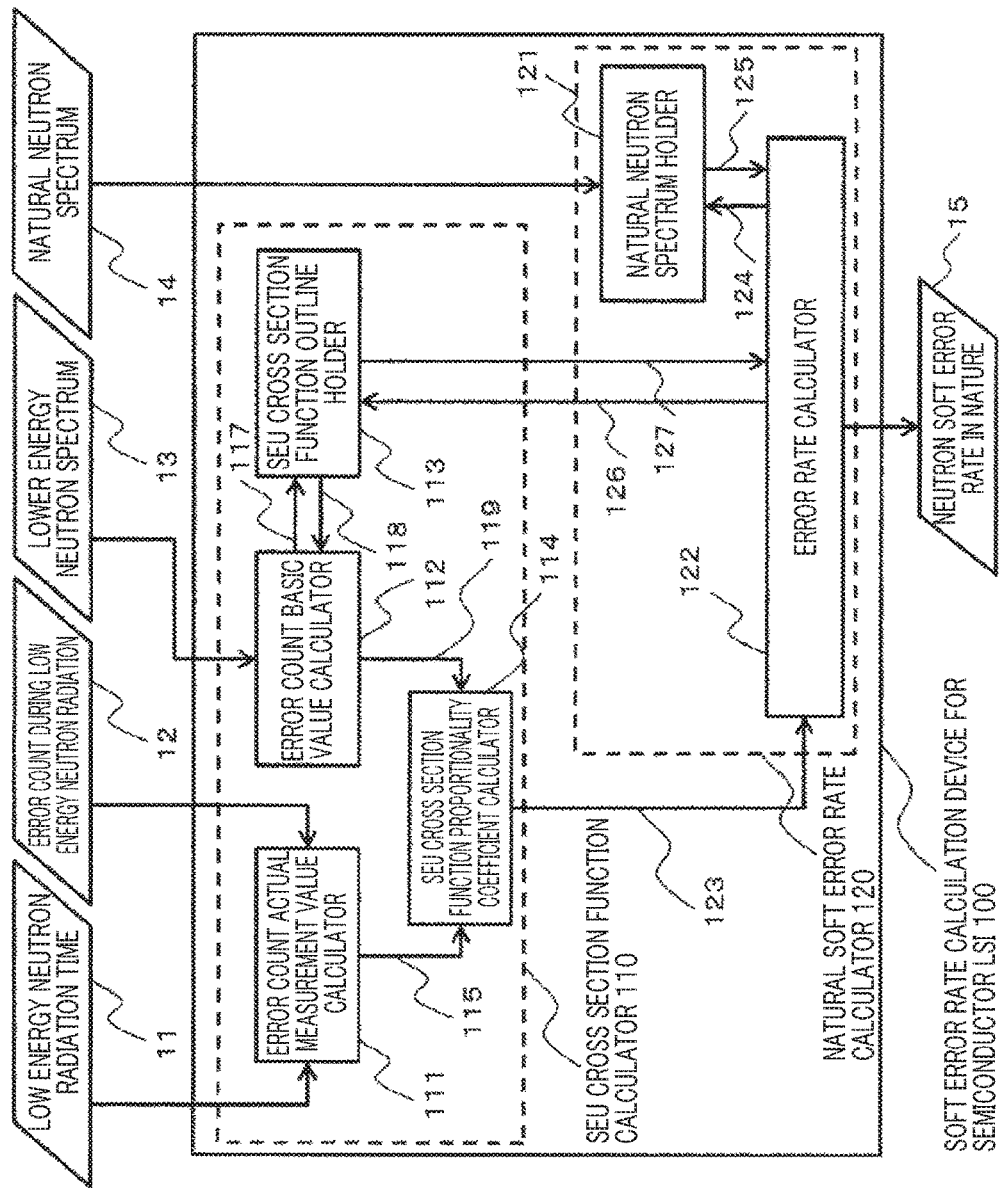
FIG. 1 is a diagram showing a configuration example of a soft error rate calculation device for semiconductor LSI according to Embodiment 1.

Impacts of soft errors representing temporary malfunctions of circuits induced by environmental radiation such as a rays and neutron rays are increasing along with miniaturization and higher integration of semiconductor devices. Designing adopting techniques for improving error tolerance such as detection and correction of error data in a memory by using the error correction code (ECC) and arithmetic error detection by using redundancy has previously been carried out as a countermeasure against the neutron rays. An acceleration experiment involving radiation of neutrons has heretofore been conducted for a neutron tolerance evaluation of a system adopting these techniques.

A spallation neutron test and a (quasi-)monoenergetic neutron test have heretofore been used as the method of an acceleration test involving the neutron radiation. The spallation neutron test is a method of obtaining an error rate on the ground from an error rate at the time of radiation of a white neutron beam having energy distribution similar to a neutron spectrum in nature. The neutron spectrum in nature covers a wide range up to several hundred megaelectron volts (MeV). Accordingly, a neutron radiation facility also needs to irradiate target LSI by outputting a neutron beam having high energy of several hundred megaelectron volts likewise. The (quasi-) monoenergetic neutron test is a method in which monoenergetic or quasi-monoenergetic neutron beams having specific energy values are radiated to obtain a neutron soft error rate for each neutron energy value of an irradiation target from an error rate of each beam, and then a single event upset (SEU) cross section function is obtained. Next, in this method, a neutron soft error rate is calculated from the SEU cross section function and the neutron spectrum on the ground. In the (quasi-) monoenergetic neutron test, it is necessary to radiate neutron beams in a range from low energy of several megaelectron volts to high energy of several hundred megaelectron volts.

In the neutron radiation facility, the neutrons are generated by accelerating particles such as protons and inducing a nuclear reaction by bombarding a target such as lithium or lead with the particles. In general, a larger accelerator is required when the accelerated particles are faster. Hence, an operating cost of the accelerator is increased and an operable facility is limited.

A principle to form the basis of this embodiment will be described. It has been known that the SEU cross section function of a semiconductor LSI device can be fitted to a cumulative density function of Weibull distribution (which will be referred to as a Weibull function in this specification). The Weibull function is expressed by the following equation:

[Formula 1]

$$W(E)=1-\exp(-(E-Eth/W)^S) \quad \text{(Equation 1)}.$$

Here, symbol E denotes the neutron energy. Symbols Eth, W, and S denote parameters that determine the form of the Weibull function. These parameters are known to take constant values according to the SEU cross section function obtained from results of numerous semiconductor LSI irradiation experiments, and such constant values will be described as $Eth_C$, $W_C$, and $S_C$, respectively. In this application, the Weibull function obtained by assigning these values will be referred to as an SEU cross section function outline W(E). The SEU cross section function of an irradiation target device is equal to a multiplication of the SEU cross section function outline by a constant. This constant will be referred to as a SEU cross section function proportionality coefficient σ in this specification.

It is known that an error count per unit time is obtained by multiplying the radiated neutron spectrum by the SEU cross section function and then integrating the obtained value with the energy E. Since it is known that the SEU cross section function is equivalent to σ times as large as the SEU cross section function outline value, the error count per unit time can be translated to a value obtained by multiplying the radiated neutron spectrum by the SEU cross section function outline value, then integrating the obtained value with the energy E (such a value will be referred to as error count basic value in this application), and then multiplying the error count basic value by the value σ.

Now, embodiments concerning a soft error calculation device for semiconductor LSI will be described below by using the drawings.

Embodiment 1

FIG. 1 represents an instance of a configuration diagram of a soft error rate calculation device for semiconductor LSI of this embodiment. A soft error rate calculation device 100 for semiconductor LSI includes a SEU cross section function calculator 110 and a natural soft error rate calculator 120.

The SEU cross section function calculator 110 includes: an error count actual measurement value calculator 111 which calculates and outputs an error count actual measurement value 115 per unit time from low energy neutron radiation time 11 and an error count 12 during low energy neutron radiation; an SEU cross section function outline holder 113 which outputs a function value 118 of an outline of an SEU cross section function corresponding to a neutron energy value 117 given by an error count basic value calculator 112; the error count basic value calculator 112 which outputs an error count basic value 119 of errors to occur per unit time based on the SEU cross section function outline value 118 obtained by inputting the neutron energy value 117 to the SEU cross section function outline holder 113, and on a low energy neutron spectrum 13; and an SEU cross section function proportionality coefficient calculator 114 which calculates a ratio between the error count basic value 119 per unit time and the error count actual measurement value 115 per unit time and thus identifies an SEU cross section function of an irradiation target device.

The low energy neutron radiation time 11 and the error count 12 during low energy neutron radiation can be obtained by irradiating evaluation target semiconductor LSI with neutrons in a low energy neutron radiation facility. The low energy neutron spectrum 13 can be actually measured in accordance with the time of flight (TOF) method, a method of deriving the spectrum from a measurement result using a bonner ball neutron detector in accordance with an unfolding method, and the like. Meanwhile, a neutron generation reaction in the radiation facility can also be calculated and obtained by a simulation of a nuclear spallation reaction.

The error count actual measurement value calculator 111 calculates an error count actual measurement value 115 ($E_{exp}$) per unit time by dividing the error count 12 during low energy neutron radiation by the low energy neutron radiation time 11, and outputs the calculated value to the SEU cross section function proportionality coefficient calculator 114.

The SEU cross section function outline holder 113 holds the values $Eth_C$, $W_C$, and $S_C$ therein, and outputs a value of the Weibull function corresponding to a desired neutron energy value generated by the error count basic value calculator 112 as the SEU cross section function outline value 118.

A numerical integration operation is executed by multiplying the SEU cross section function outline value 118, which is obtained by inputting the desired energy value 117 generated by the error count basic value calculator 112 to the SEU cross section function outline holder 113, by the low energy neutron spectrum 13, and an error count basic value $E_{base}$ 119 of errors to occur per unit time is thus derived and outputted. This calculation is expressed by (Equation 2):

[Formula 2]

$$E_{base}=\int_0^\infty W(E)\times\phi_{lowE}(E)dE \quad \text{(Equation 2)}.$$

Here, symbol $\phi_{lowE}$ (E) represents a numerical formula of the low energy neutron spectrum 13.

The SEU cross section function proportionality coefficient calculator 114 obtains an SEU cross section function proportionality coefficient σ 123 by calculation of a ratio by dividing the value $E_{exp}$ by the value $E_{base}$, and outputs the obtained value to the natural soft error rate calculator 120.

The natural soft error rate calculator 120 includes: a natural neutron spectrum holder 121 which holds an inputted natural neutron spectrum 14 and outputs a natural neutron flux 125 corresponding to a neutron energy value 124 given by an error rate calculator 122; and the error rate calculator 122 which calculates and outputs a neutron soft error rate 15 in nature of the semiconductor LSI from the SEU cross section function outline and the natural neutron spectrum 14.

The natural neutron spectrum holder 121 holds the natural neutron spectrum 14 inputted to the soft error calculation device 100 for semiconductor LSI according to the present invention, and outputs the natural neutron flux 125 corresponding to the neutron energy value 124 given by the error rate calculator 122. The natural neutron spectrum 14 can be acquired by referring to JEDEC Standard No. 89A and the like.

The error rate calculator 122 executes a numerical integration operation in such a way that a product of an outline value 127 of the SEU cross section function, which is obtained by inputting a desired energy value 126 to the SEU cross section function outline holder 113, by the SEU cross section function proportionality coefficient σ 123 obtained from the SEU cross section function proportionality coefficient calculator 114, namely, the SEU cross section function of the semiconductor LSI is multiplied by the neutron flux 125 obtained by inputting the desired neutron energy value 124 to the natural neutron spectrum holder 121, thereby deriving an error count $E_n$ per unit time. This calculation is expressed by (Equation 3):

[Formula 3]

$$E_N = \int_0^\infty \sigma W(E) \times \phi_n(E) dE \quad \text{(Equation 3)}.$$

Here, symbol $\phi_n(E)$ represents a numerical formula of the natural neutron spectrum 14. The error count per unit time, that is, the error rate is outputted as the neutron soft error rate 15 in nature. In general, however, the soft error rate is often expressed by failures-in-time (FIT) unit (an error count in $10^9$ hours). Accordingly, when all the physical amounts are expressed by the MKS system, for example, the soft error rate can be converted into the FIT unit (Equation 4) by multiplying the error count per unit time by $3600 \times 10^9$:

[Formula 4]

$$E_N = 3600 \times 10^9 \times \int_0^\infty \sigma W(E) \times \phi_n(E) dE \quad \text{(Equation 4)}.$$

The above-mentioned result may be outputted as the neutron soft error rate 15 in nature.

Figure 2:
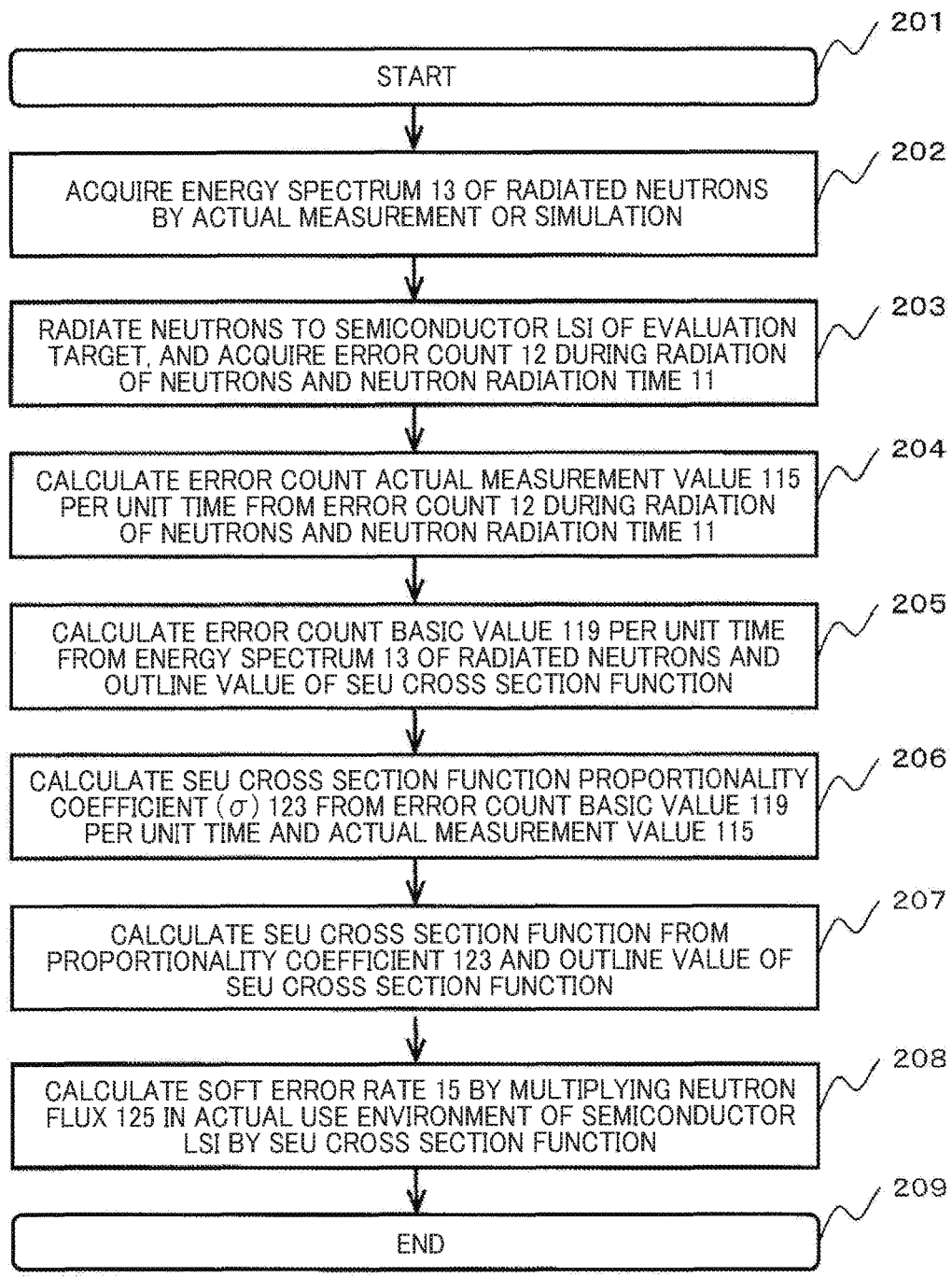
FIG. 2 is a diagram showing an example of a soft error tolerance evaluation flow for the semiconductor LSI of Embodiment 1.

FIG. 2 shows a neutron tolerance evaluation flow for the semiconductor LSI of this embodiment. The data to be inputted to the soft error calculation device for semiconductor LSI of this embodiment are acquired to begin with. The low energy neutron spectrum 13 is acquired either by actual measurement of a neutron beam spectrum or by simulation that simulates a facility (202). Here, the low energy is set equal to or below 50 MeV. However, the energy may be set above this value. Next, the above-mentioned neutron beam is radiated to the semiconductor LSI. At this time, the radiation time and the error count during the radiation are counted (203). The calculation of the soft error rate is executed by using the data acquired in these steps. First, the error count per unit time is calculated from the neutron radiation time and the error count during the radiation (204). Next, the error count basic value per unit time is calculated from an energy spectrum of the radiated neutrons and the outline of the SEU cross section function (205), and the SEU cross section function proportionality coefficient σ is calculated by computing the ratio with the actual measurement value (206), thereby deriving the SEU cross section function (207). Lastly, the soft error rate is calculated by multiplying the neutron spectrum in nature by the SEU cross section function (208).

Figure 3:
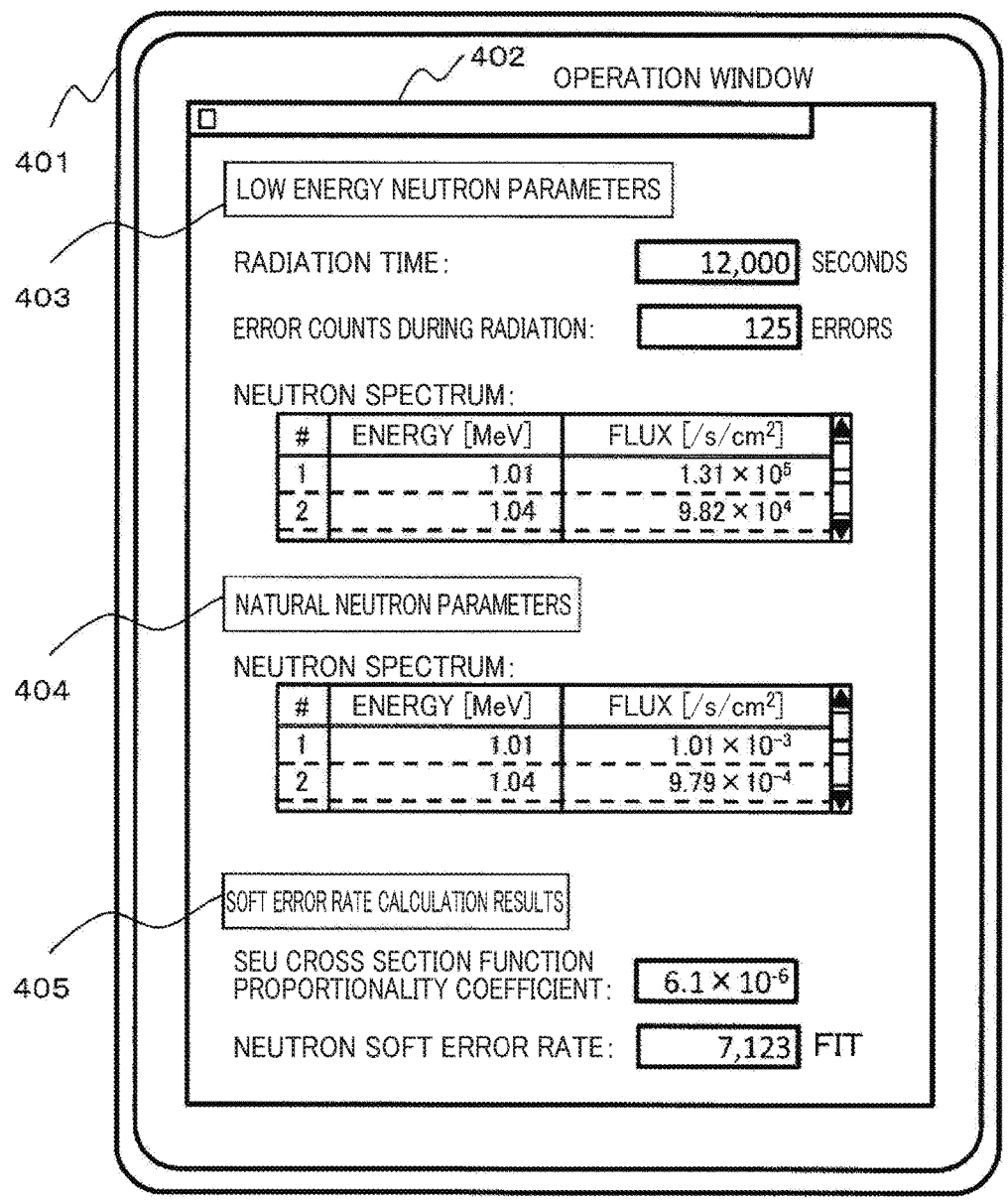
FIG. 3 shows an example of a user operation screen 401 at the time of calculating a soft error rate for the semiconductor LSI in Embodiment 1.

FIG. 3 shows an example of a user operation screen 401 at the time of calculating the soft error rate for the semiconductor LSI in Embodiment 1. An operation window 402 for the calculation of the soft error rate for the semiconductor LSI of the error rate calculation target is displayed on this screen 401. The operation window 402 contains low energy neutron parameters 403, natural neutron parameters 404, and soft error rate calculation results 405 collectively as information.

The low energy neutron parameters 403 display parameters of the radiated low energy neutrons in the soft error rate calculation device 100, and a user can input and set the parameters. In this embodiment, such parameters include: "radiation time" which corresponds to the low energy neutron radiation time 11; "error count during radiation" which corresponds to the error count 12 during low energy neutron radiation; and "neutron spectrum (neutron energy [MeV], flux [/s/cm²])" which corresponds to the low energy neutron spectrum 13, for instance.

The natural neutron parameters 404 display the neutron spectrum in nature used in the calculation of the soft error rate, and the user can input and set the parameters. In this embodiment, such parameters include "neutron spectrum (neutron energy [MeV], flux [/s/cm2])" which corresponds to the natural neutron spectrum 14, for instance.

The soft error rate calculation results 405 display the neutron soft error rate 15 in nature calculated by using this embodiment as "neutron soft error rate". As an additional display content, the SEU cross section function proportionality coefficient 123 is displayed therein.

Embodiment 2

Figure 4:
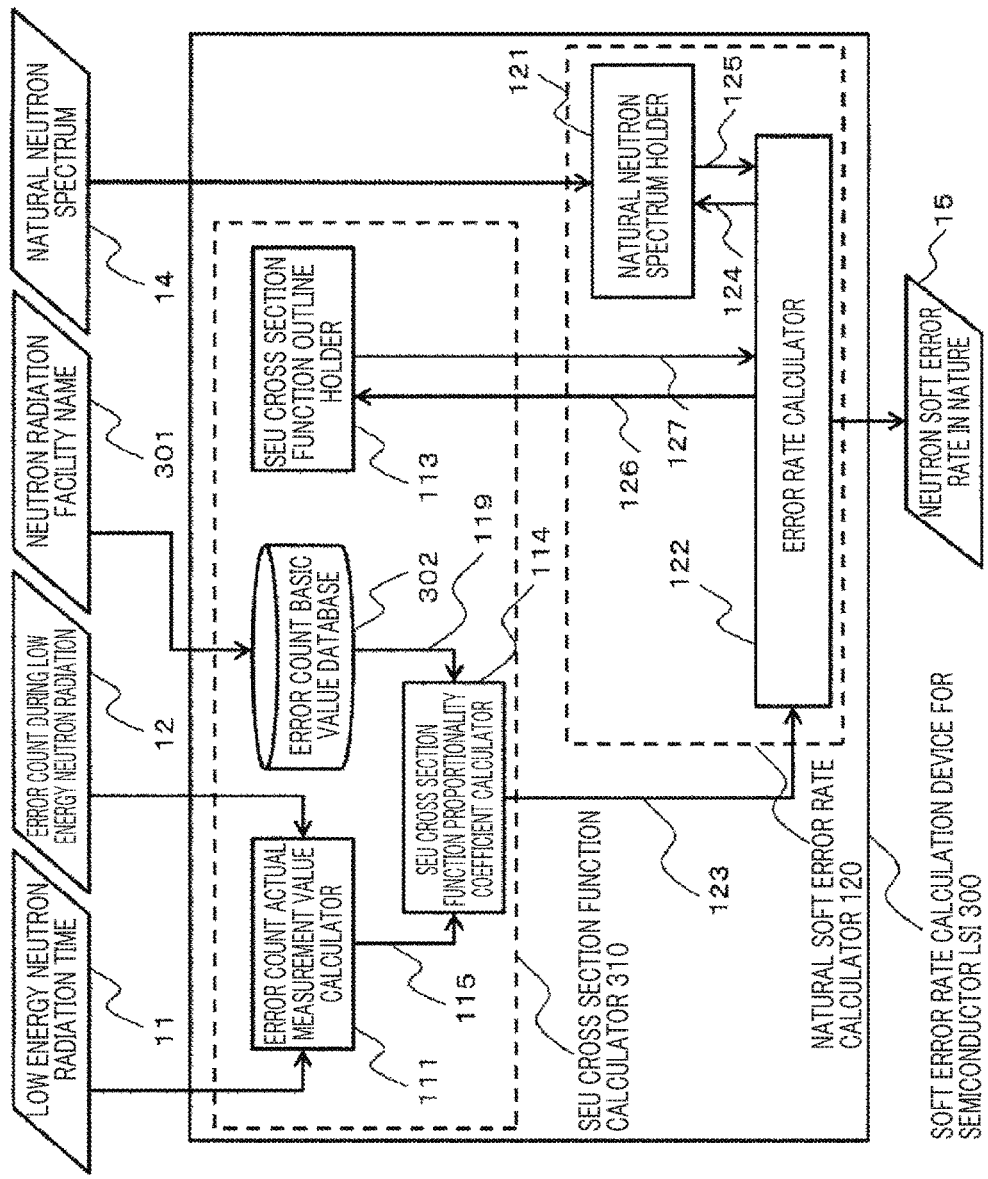
FIG. 4 is a diagram showing a configuration example of a soft error rate calculation device for semiconductor LSI according to Embodiment 2.

FIG. 4 represents an instance of a configuration diagram of a soft error rate calculation device for semiconductor LSI of Embodiment 2. Portions which are the same as those in FIG. 1 are designated by the same reference signs, and explanations thereof are omitted because the configurations and operations are the same.

In this tolerance evaluation flow, the outline value of the SEU cross section function is universal and the radiated neutron beam spectrum is unique to the neutron radiation facility. Therefore, if the same neutron tolerance evaluation facility is used, then calculation time can be reduced by calculating the error count basic value for unit time in advance and universally using this value. In a soft error rate calculation device 300 for semiconductor LSI according to Embodiment 2, the soft error rate calculation device 300 for semiconductor LSI includes an error count basic value database 302 to record the error count basic value per unit time calculated in advance, which represents a numerical value unique to the radiation facility.

The error count basic value database 302 outputs the error count basic value 119 corresponding to an inputted neutron radiation facility name 301. A conceivable method of implementing the error count basic value database 302 is implementation in the form of a lookup table that records an association of the neutron radiation facility name 301 with the error count basic value 119, for example. There is an effect to reduce calculation time because a search in the lookup table can be executed at a higher speed than the numerical integration operation involving the functions.

REFERENCE SIGNS LIST 11 low energy neutron radiation time
12 error count during low energy neutron radiation
13 low energy neutron spectrum
14 natural neutron spectrum
15 neutron soft error rate in nature
100 soft error rate calculation device for semiconductor LSI
110 SEU cross section function calculator
111 error count actual measurement value calculator
112 error count basic value calculator
113 SEU cross section function outline holder
114 SEU cross section function proportionality coefficient calculator
120 natural soft error rate calculator 121 natural neutron spectrum holder
122 error rate calculator

The invention claimed is:

1. A soft error rate calculation device that estimates a soft error rate induced by neutrons in a semiconductor Large Scale Integration (LSI), the soft error rate calculation device comprising:
    a cross section function outline holder configured to output an outline value of a single event upset (SEU) cross section function based on an outline of the SEU cross section function, wherein the SEU cross section function corresponds to a given neutron energy value and;
    an error count basic value calculator configured to calculate an error count basic value of errors to occur per unit time from the outline value of the SEU cross section function and low energy neutron spectrum data;
    an error count actual measurement value calculator configured to calculate an error count actual measurement value per unit time from an error count during radiation of low energy neutrons and low energy neutron radiation time;
    a proportionality coefficient calculator configured to calculate a proportionality coefficient of the SEU cross section function from the error count basic value per unit time and the error count actual measurement value per unit time;
    a natural neutron spectrum holder configured to hold a natural neutron spectrum and to output a neutron flux corresponding to a neutron energy value sent from an error rate calculator; and
    an error rate calculator configured to calculate the soft error rate of a semiconductor device by executing an integration operation by multiplying the SEU cross section function, which is defined by the outline of the SEU cross section function and the proportionality coefficient, by the natural neutron spectrum.

2. The soft error rate calculation device according to claim 1, wherein
    the error count basic value calculator includes a lookup table recording an association of a neutron radiation facility name with the error count basic value, and the error count basic value is acquired and outputted by a search in the lookup table.

3. The soft error rate calculation device according to claim 1, wherein
    energy of the low energy neutrons is equal to or below 50 MeV.

4. A soft error rate calculation method to estimate a soft error rate induced by neutrons in nature in a semiconductor Large Scale Integration (LSI), the method comprising:
    outputting an outline value of a single event upset (SEU) cross section function based on an outline of the SEU cross section function, wherein the SEU cross section function corresponds to a given neutron energy value;
    calculating an error count basic value of errors to occur per unit time from the outline value of the SEU cross section function and low energy neutron spectrum data;
    calculating an error count actual measurement value per unit time from an error count during radiation of the low energy neutrons and low energy neutron radiation time;
    calculating a proportionality coefficient of the SEU cross section function from the error count basic value per unit time and the error count actual measurement value per unit time;
    holding a natural neutron spectrum and outputting a neutron flux corresponding to a neutron energy value sent from an error rate calculator; and
    calculating the soft error rate of a semiconductor device in nature by executing an integration operation by multiplying the SEU cross section function, which is defined by the outline of the SEU cross section function and the proportionality coefficient, by the natural neutron spectrum.

5. The method according to claim 4, wherein a lookup table is prepared which records an association of a neutron radiation facility name with the error count basic value, and the error count basic value is acquired and outputted by a search in the lookup table.

6. The method according to claim 4, wherein
    energy of the low energy neutrons is equal to or below 50 MeV.

* * * * *